United States Patent
Maas et al.

(10) Patent No.: US 11,996,267 B2
(45) Date of Patent: May 28, 2024

(54) PARTICLE BEAM APPARATUS, DEFECT REPAIR METHOD, LITHOGRAPHIC EXPOSURE PROCESS AND LITHOGRAPHIC SYSTEM

(71) Applicant: ASML NETHERLANDS B.V., Veldhoven (NL)

(72) Inventors: Ruben Cornelis Maas, Utrecht (NL); Alexey Olegovich Polyakov, Veldhoven (NL); Teis Johan Coenen, Vught (NL)

(73) Assignee: ASML NETHERLANDS B.V., Veldhoven (NL)

( * ) Notice: Subject to any disclaimer, the term of this patent is extended or adjusted under 35 U.S.C. 154(b) by 510 days.

(21) Appl. No.: 17/271,667

(22) PCT Filed: Aug. 22, 2019

(86) PCT No.: PCT/EP2019/072489
§ 371 (c)(1),
(2) Date: Feb. 26, 2021

(87) PCT Pub. No.: WO2020/057894
PCT Pub. Date: Mar. 26, 2020

(65) Prior Publication Data
US 2021/0327678 A1 Oct. 21, 2021

(30) Foreign Application Priority Data
Sep. 19, 2018 (EP) .................................. 18195475

(51) Int. Cl.
*H01J 37/304* (2006.01)
*G03F 7/00* (2006.01)
(Continued)

(52) U.S. Cl.
CPC ........ *H01J 37/304* (2013.01); *G03F 7/70591* (2013.01); *H01J 37/1474* (2013.01);
(Continued)

(58) Field of Classification Search
CPC ...................................................... H01L 21/263
See application file for complete search history.

(56) References Cited

U.S. PATENT DOCUMENTS 7,588,870 B2   9/2009   Sandstrom
9,507,907 B2   11/2016  Fouquet et al.
(Continued)

FOREIGN PATENT DOCUMENTS

CN     1459048      11/2003
DE    102013225936  6/2015
(Continued)

OTHER PUBLICATIONS

International Search Report and Written Opinion issued in corresponding PCT Patent Application No. PCT/EP2019/072489, dated Sep. 23, 2019.
(Continued)

*Primary Examiner* — William A Harriston
(74) *Attorney, Agent, or Firm* — Pillsbury Winthrop Shaw Pittman, LLP (57) ABSTRACT

A particle beam apparatus includes an object table configured to hold a semiconductor substrate; a particle beam source configured to generate a particle beam; a detector configured to detect a response of the substrate caused by interaction of the particle beam with the substrate and to output a detector signal representative of the response; and a processing unit configured to: receive or determine a location of one or more defect target areas on the substrate; control the particle beam source to inspect the one or more defect target areas; identify one or more defects within the one or more defect target areas, based on the detector signal obtained during the inspection of the one or more defect target areas; control the particle beam source to repair the one or more defects.

20 Claims, 7 Drawing Sheets

(51) Int. Cl.
  *H01J 37/147* (2006.01)
  *H01J 37/302* (2006.01)
  *H01J 37/317* (2006.01)
  *H01L 21/263* (2006.01)

(52) U.S. Cl.
  CPC ...... *H01J 37/3023* (2013.01); *H01J 37/3174* (2013.01); *H01L 21/263* (2013.01); *H01J 2237/31755* (2013.01)

(56) References Cited

U.S. PATENT DOCUMENTS

| | | |
|---|---|---|
| 9,842,186 B2 | 12/2017 | Chen et al. |
| 9,990,451 B2 | 6/2018 | Hunsche et al. |
| 2004/0121069 A1 | 6/2004 | Ferranti et al. |
| 2015/0169997 A1* | 6/2015 | Weber ............... H01J 37/26 382/145 |
| 2017/0292923 A1 | 10/2017 | Baralia et al. |
| 2018/0031981 A1 | 2/2018 | Vellanki et al. |

FOREIGN PATENT DOCUMENTS

| | | |
|---|---|---|
| TW | 201802465 | 1/2018 |
| WO | 2004015496 | 2/2004 |

OTHER PUBLICATIONS

European Search Report issued in corresponding European Patent Application No. 18195475, dated Apr. 8, 2019.
Taiwanese Office Action issued in corresponding Taiwanese Patent Application No. 108131997, dated Apr. 23, 2020.
Office Action issued in corresponding Chinese Patent Application No. 201980061382, dated Jan. 17, 2024.

* cited by examiner

PARTICLE BEAM APPARATUS, DEFECT REPAIR METHOD, LITHOGRAPHIC EXPOSURE PROCESS AND LITHOGRAPHIC SYSTEM

CROSS-REFERENCE TO RELATED APPLICATIONS

This application is the U.S. national phase entry of PCT Patent Application No. PCT/EP2019/072489, which was filed on Aug. 22, 2019, which claims the benefit of priority of European Patent Application No. 18195475.1 which was filed on Sep. 19, 2018 and which is incorporated herein in its entirety by reference.

BACKGROUND

Field of the Invention

The present invention relates to a particle beam apparatus, a defect repair method, a lithographic exposure process and a lithographic system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The radiation beam as typically applied in lithographic apparatuses may e.g. be a DUV radiation beam (e.g. having a wavelength of 248 nm or 193 nm) or an EUV radiation beam (e.g.

having a wavelength of 11 nm or 13.5 nm).

The manufacturing of an integrated circuit may typically require the stacking of a plurality of layers, whereby the layers need to be accurately aligned. Without such an alignment, a required connection between layers may be flawed, resulting in a malfunctioning of the integrated circuit.

Typically, the bottom layer or layers of the integrated circuit will contain the smallest structures, such as transistors or components thereof. The structures of subsequent layers are typically larger and enable connections of the structures in the bottom layers to the outside world. In view of this, an alignment of two layers will be the most challenging in the bottom portion of the integrated circuit.

Due to the application of radiation beams with smaller wavelengths, e.g. EUV radiation having a wavelength of 11 or 13.5 nm, it has become more cumbersome to ensure that each portion of an exposed substrate receives the appropriate dosage of radiation, in order for the exposed pattern to be properly developed. As the photon energy increases (the photon energy being inversely proportional to the wavelength), the total number of photons required for exposing a certain feature decreases. In addition, the requirement of exposing smaller features results in even fewer photons contributing to the exposure process of a feature. As a result, it may occur that certain features remain underexposed, i.e. receive an insufficient dosage or radiation.

In order to verify that a circuit or a circuit layer is properly patterned, substrates are often subjected to inspection, using inspection tools such as e-beam inspection tools. Such tools may e.g. be applied to assess whether or not certain process steps, as. e.g. performed by a lithographic apparatus, are executed as expected. As an example, using such an inspection tool, an assessment can be made whether or not a particular area of a substrate has been subjected to a sufficient dosage or radiation. Such an assessment may then e.g. be used to optimize or adjust the exposure process of other substrates.

It would be desirable to improve the functionality of inspection tools such as e-beam inspection tools, in order to improve the overall lithographic manufacturing process of semiconductor devices.

SUMMARY

It is desirable to improve the functionality of inspection tools or apparatuses such as e-beam inspection tools.

In order to address these concerns, according to an aspect of the present invention, there is provided a particle beam apparatus comprising:
  an object table configured to hold a semiconductor substrate;
  a particle beam source configured to generate a particle beam;
  a detector configured to detect a response of the substrate caused by interaction of the particle beam with the substrate and to output a detector signal representative of the response;
  a processing unit configured to:
    a. receive or determine a location of one or more defect target areas on the substrate;
    b. control the particle beam source to inspect the one or more defect target areas;
    c. identify one or more defects within the one or more defect target areas, based on the detector signal obtained during the inspection of the one or more defect target areas;
    d. control the particle beam source to repair the one or more defects.

According to another aspect of the present invention, there is provided a defect repair method comprising:
  receiving a substrate comprising a patterned resist layer;
  receiving or determining a location of one or more defect target areas on the substrate;
  inspecting the one or more defect target areas of the patterned resist layer;
  determining a position of one or more defects in the one or more defect target areas based on the inspection;
  modifying the patterned resist layer at the one or more defects to repair the defects.

According to another aspect of the present invention, there is provided a lithographic exposure process comprising:

patterning a resist layer of a substrate by exposing the resist layer to a patterned radiation beam;

logging or recording exposure process data during the exposing of the resist layer;

determining, based on the exposure process data, a location of one or more defect target areas;

inspecting the one or more defect target areas, thereby identifying one or more defects in the one or more defect target areas;

modifying the patterned resist layer at the one or more defects to repair the defects.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
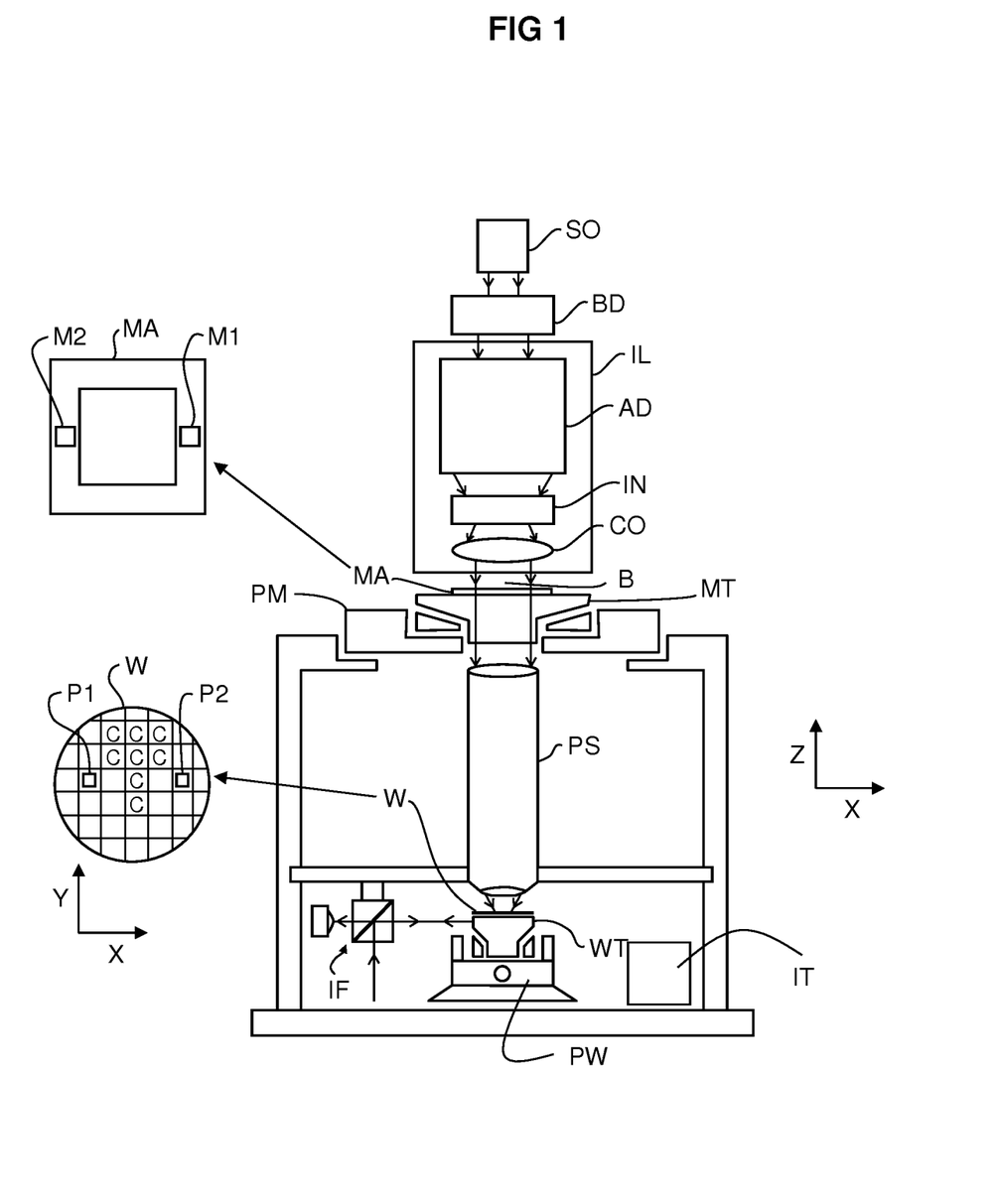
FIG. 1 depicts a lithographic apparatus as can be applied in an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask)

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In the embodiment as shown, the lithographic apparatus further comprises an inspection tool IT according to the invention. Such an inspection tool IT may e.g. enable to determine a characteristic of a structure, in particular a buried structure that is present on or in an area of interest of a substrate W that is processed by the lithographic apparatus. In an embodiment, as will be discussed in more detail below, the inspection tool may comprise an electron beam source for inspecting the substrate.

In an embodiment, the second positioning device PW may be configured to position the substrate W in the operating range of the inspection tool IT. In such an embodiment, the inspection tool IT may e.g. be configured to determine a characteristic of the mentioned structure, e.g. an electric characteristic, a material characteristic and/or a geometric characteristic. In an embodiment, this information may subsequently be provided to a control unit of the lithographic apparatus and used during the exposure process, e.g. by controlling one or more of the illumination system, the projection system or one of the positioning devices, based on the information.

In the embodiment as shown, the lithographic apparatus may be configured to apply DUV radiation for the radiation beam. In such case, the patterning device MA may be a transmissive patterning device and the projection system PS may comprise one or more lenses.

Alternatively, the lithographic apparatus according to the present invention may be configured to apply EUV radiation for the radiation beam. In such case, the patterning device MA may be a reflective patterning device and the projection system PS may comprise one or more mirrors. In such embodiment, the apparatus may comprise one or more vacuum chambers for housing the illumination system IL and/or the projection system PS.

In accordance with an aspect of the present invention, the lithographic apparatus may comprise an inspection and repair apparatus or particle beam apparatus according to the present invention, in order to perform an inline or offline inspection and repair of a substrate that is to be processed or has been processed.

Figure 2:
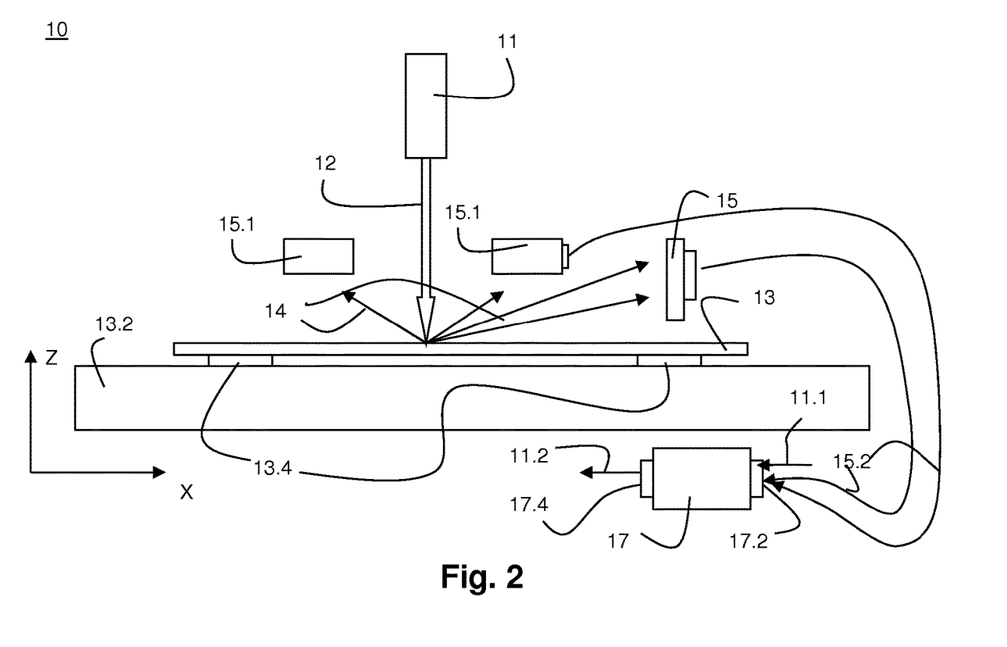
FIG. 2 depicts a particle beam apparatus according to an embodiment of the invention.

According to an aspect of the invention, there is provided a particle beam apparatus that is configured to inspect an object such as a semiconductor substrate and is further configured to, when required, repair certain defects on the object. FIG. 2 schematically shows an embodiment of such a particle beam apparatus 10. In the embodiment as shown, the particle beam apparatus comprises a particle beam source 11. In an embodiment, the particle beam source 11 comprises an electron beam source, also referred to as an e-beam source.

A particle beam source 11, such as an e-beam source, is known in general, and may be applied in the present invention to project a particle beam 12, e.g. an electron beam, onto an area of an object 13, e.g. a substrate. In the embodiment as shown, the object 13 is mounted to an object table 13.2 of the apparatus by means of a clamping mechanism 13.4, e.g. a vacuum clamp or an electrostatic clamp. In case of an electron beam source, said source may e.g. be used to generate an electron beam 12 having an energy ranging from 0.2 keV to 100 keV. A particle beam source 11 may typically have one or more lenses for focusing the particle beam 12 onto the object 13. In an embodiment, the apparatus 10 may further comprise one or more scanning coils or deflector plates which may deflect the particle beam 12. By doing so, the particle beam 12 may e.g. be deflected along an X-axis and an Y-axis (perpendicular to the X-axis and the Z-axis), the XY-plane being parallel to a surface of the object, such that an area of the object can be scanned. An arrangement of one or more scanning coils or deflector plates may be referred to as a beam deflector. Such a beam deflector may be configured to direct the particle beam onto a desired location of the object 13. In an embodiment of the present invention, the particle beam source is configured to project a plurality of electron beams onto a respective plurality of sub-areas of the object 13. By doing so, the area of interest that can be examined or inspected per unit of time may be enlarged. Further, in an embodiment of the present invention, the particle beam source may be configured to vary or adjust the energy level or dose of the generated one or more particle beams. In such embodiment, the particle beam source may thus be configured to vary the current characterizing the electron beam or electron beams.

In case of the application of an electron beam as the particle beam, various interactions on the surface and interactions with the material below the surface will occur, resulting in the exposed surface emitting both radiation and electrons. Typically, when such an electron beam 12 interacts with a sample, the electrons constituting the beam will lose energy through scattering and absorption, within a teardrop-shaped volume, known as the interaction volume. The energy exchange between the electron beam and the sample will typically result in a combination of:

- an emission of secondary electrons by inelastic scattering,
- an emission of electrons that are reflected or back-scattered out of the interaction volume by elastic scattering interactions with the sample,
- coupling to phonons (lattice vibrations)
- X-ray emission, and
- an emission of electromagnetic radiation, e.g. in a range from deep UV to IR.

The latter emission of electromagnetic radiation is generally referred to as cathodoluminescent light or CL-light.

In an embodiment of the present invention, the particle beam apparatus 10 further comprises a detector 15. Such a detector may be configured to detect particular interactions of the electron beam, in general the particle beam, with the object. As an example, the detector 15 may be configured to detect secondary electrons. In an embodiment, the particle beam apparatus 10 may comprise a plurality of detectors, each configured to detect a particular interaction between the particle beam and the object. In the embodiment as shown, the particle beam apparatus further comprises a detector 15.1 for detecting back-scattering electrons as emitted by the object 13.

In FIG. 2, the arrows 14 are indicative for the emitted secondary or back-scattering electrons.

In accordance with the present invention, the detector or detectors as applied, e.g. detectors 15 and 15.1 are configured to detect a response of the substrate, the response being caused by interaction of the particle beam 12 with the object 13, e.g. a semiconductor substrate. The detector or detectors may further be configured to output a detector signal representative of the detected response, e.g. the detected secondary or back-scattering electrons.

In an embodiment of the present invention, the particle beam apparatus comprises a secondary electron detector to perform a low dose inspection scan to inspect one or more defect target areas, as will be explained in more detail below.

In the embodiment as shown, the particle beam apparatus further comprises a processing unit 17, e.g. comprising a microprocessor, computer or the like, for processing detector signals received from the detectors, the detector signals e.g. representing the emitted secondary or back-scattering electrons as detected by the detectors 15 and 15.1.

In the embodiment as shown, the processing unit 17 comprises an input terminal 17.2 for receiving detector signals 15.2 from the detectors 15, 15.1, the signals 15.2 e.g. representing detected emitted secondary or back-scattering electrons.

In the embodiment, the processing unit further has an output terminal 17.4 for outputting a control signal 11.2 for controlling the particle beam source 11.

The particle beam apparatus according to the present invention is further configured to inspect semiconductor substrates that have been provided with a patterned resist layer and, when required, correct or repair certain defects in the patterned resist layer that have been found during the inspection. In order to realize this, the processing unit 17 of the particle beam apparatus according to the present invention is configured to inspect one or more target areas on the substrates, which target areas potentially contain one or more defects and/or have an elevated risk of containing one or more defects. Such target areas are further on referred to as defect target areas or defect prone target areas.

In an embodiment of the present invention, the processing unit 17 of the particle beam apparatus is configured to receive, e.g. at the input terminal 17.2, an input signal 11.1 representing a location of one or more defect target areas of the substrate that is to be inspected.

Alternatively, or in addition, the processing unit 17 of the particle beam apparatus 10 may be configured to determine a location of one or more defect target areas based on information received. In particular, in an embodiment of the present invention, the processing unit 17 of the particle beam apparatus is configured to receive exposure process data, e.g. from a lithographic apparatus that has conducted the exposure process resulting in the patterned resist layer. In such embodiment, the input signal 11.1 as received by the processing unit 17 may thus represent such exposure process data. As will be explained in more detail below, based on the exposure process data as received, the processing unit 17 may be configured to determine at which locations on the substrates defective features or structures may be present.

In accordance with the present invention, the processing unit 17 of the particle beam apparatus may conduct, when the locations of one or more defect target areas have been determined or received, control the particle beam source and/or a beam deflector such that the defect target areas are inspected. In an embodiment, such an inspection may involve scanning the defect target areas using a particle beam as generated by the particle beam source. During such scanning of the defect target area, a response of the substrate to said particle beam may be detected, as discussed above, by a detector of the particle beam apparatus. During such scanning, the detector may e.g. record the response as received and/or generate an output signal, referred to as a detector signal, representative of the received response. The received response of the detector may e.g. comprise radiation or particles as emitted by the substrate in response to the impinging particle beam. Note that a detector signal representing the received response may also be generated and outputted after the scanning of the defect target area or areas has been performed. As indicated in FIG. 2, the detector signal or signals 15.2, representing the received response of the detectors, may be provided to the processing unit 17. In accordance with the present invention, the processing unit 17 may then be configured to identify, based on the detector signal received, one or more defects within the one or more defect target areas. In particular, the processing unit may be configured to determine a location of one or more defects within the one or more defect target areas. As an example, the patterned resist layer may comprise a pattern representing a plurality of contact holes. Typically, as also indicated above, with reference to FIG. 1, a substrate is provided with a plurality of target portions, whereby a particular pattern is provided to each of these target portions, e.g. a pattern comprising a plurality of contact holes. In case on or more contact holes have been subjected, during an exposure process performed by a lithographic apparatus, to an insufficient radiation dosage, or in case a particular portion of a target portion of the substrate was, to a certain extent, out-of-focus, said contact holes may not have the required dimensions, and may thus be considered defects.

In accordance with the present invention, the particle beam apparatus is configured to, in case such defects are encountered, repair such defects. In particular, in accordance with the present invention, the processing unit 17 of the particle beam apparatus 10 is configured to control the particle beam source to repair the defects that were found as a result of the inspection of the defect target areas. Such a repair can e.g. be realized by subjecting the defect, i.e. the defective feature or structure, to a particle beam, e.g. an electron beam.

As will be appreciated by the skilled person, when a resist layer, e.g. a patterned resist layer on a substrate, is subjected to a particle beam, e.g. an electron beam, the particle beam affects the patterned resist layer. In particular, the application of a particle beam to a resist layer may result in a change in the geometry of the resist layer. Such a phenomenon is generally known as resist shrinkage.

Such resist shrinkage occurs because the electron beam as applied locally heats up the resist, causing the polymer of the resist to outgas or to reconfigure. The heat is generated because electrons transfer part of their energy to the material through phonon coupling.

In general, this phenomenon is an undesired side-effect of the inspection process as applied in particle beam inspection tools such as e-beam or electron beam inspection tools.

Typically, in order to obtain a sufficient signal-to-noise ratio, an inspection tool such as an e-beam inspection tool scans an area of interest multiple times, whereby the multiple scans are combined to arrive at an image or representation of the area of interest. However, during each of said scans, the area that is scanned is affected.

In an embodiment of the present invention, the phenomenon of resist shrinkage is deliberately applied to modify a patterned resist layer, in order to repair defects in the patterned resist layer.

Figure 3:
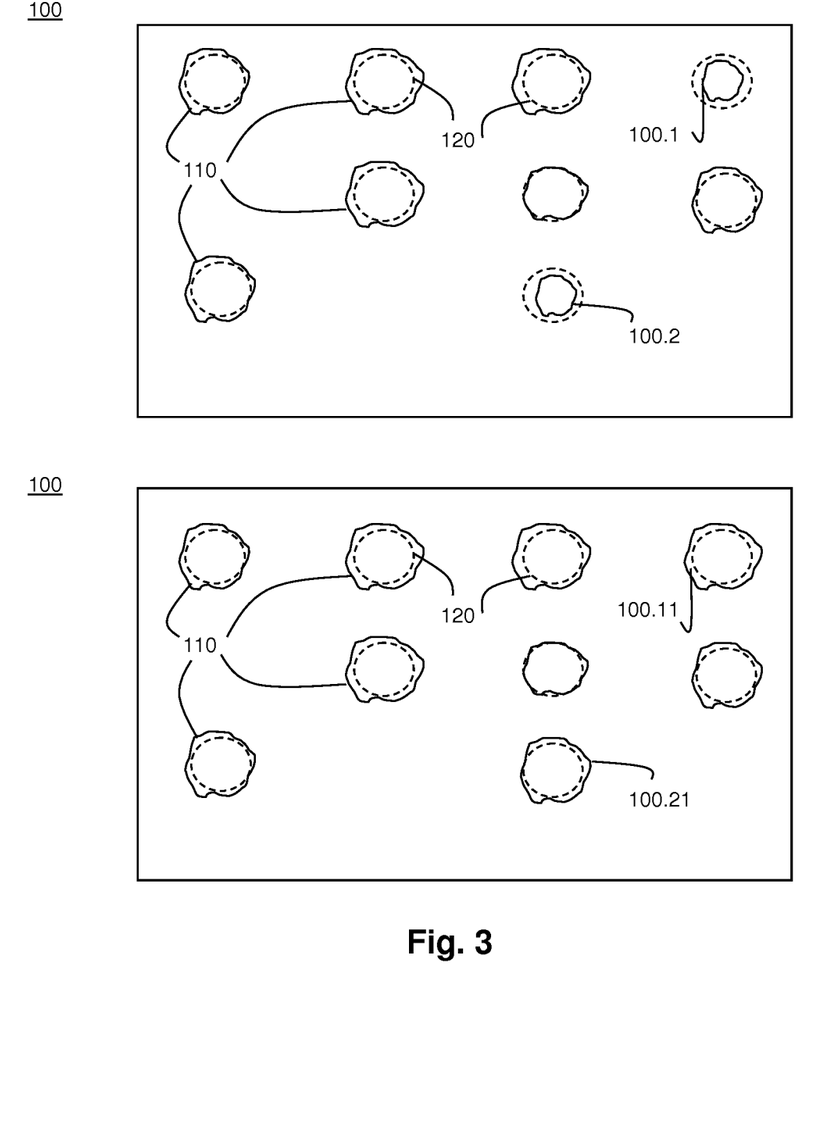
FIG. 3 illustrates an inspection and repair process of an array of contact holes.

In an embodiment of the present invention, the particle beam apparatus is an electron beam apparatus. In such an apparatus, the particle beam source may be an electron beam source or e-beam source. In such embodiment, the processing unit of the apparatus may be configured to inspect one or more defect target areas on the substrate by means of an electron beam, in order to detect the presence of defects in the defect target areas. When such defects are found, the processing unit may then be configured to control the electron beam source to correct the defects. As an example, a defective contact hole may be mentioned. In order to comply with requirements, a contact hole should have a diameter and depth within predetermined ranges. In case a contact hole has received an insufficient dosage of radiation, the contact hole may be too small (the diameter being too small) or the depth may be insufficient, or both. Using an electron beam, a defective contact hole can be repaired such that both the diameter and depth are within the desired range. Such an embodiment is schematically illustrated in FIG. 3. The upper portion of FIG. 3 schematically depicts a portion of a patterned resist layer 100 that is used in the process of generating an array of contact holes, the patterned resist layer comprising a plurality of holes, indicated by the contours 110 of the holes. The dotted lines 120 represent a minimum diameter for the holes in order to result in a proper contact hole. An image of such a portion of a patterned resist layer 100 may e.g. be obtained using a particle beam apparatus according to the present invention. By scanning the portion of the patterned resist layer 100, e.g. using an electron beam, an image of the holes in the patterned resist layer 100 can be obtained. By processing of such image, e.g. by the processing unit 17 as shown in FIG. 2, the contours 110 of the holes can be made as well as an assessment of the accuracy of the holes, i.e. whether the dimensions of the holes are within specification. In the embodiment as shown, the portion of the patterned resist layer 100 may e.g. correspond to one of the defect target areas of a patterned resist layer, i.e. an area where a defect might occur. In the embodiment as shown, two defects are present in the portion of the patterned resist layer 100; as can be seen, holes 100.1 and 100.2 of the plurality of holes 110 have their contour located inside the minimum diameter 110, i.e. they are too small. In an embodiment, the defects, i.e. the defective holes, can be repaired using the particle beam apparatus according to the present invention. In particular, a particle beam, e.g. an electron beam of a particle beam apparatus according to the present invention can be used to enlarge the defective holes. In particular, by scanning the defective holes again, using a particle beam, e.g. an electron beam, the defective holes can be enlarged. Alternatively, or in addition, a scanning along the circumference of the defective hole with an electron beam may be performed in order to enlarge the defective hole. Such an additional scanning can e.g. include scanning along the contours 100.1 and 100.2 and/or a scanning along the desired diameter 120 of the contact holes. By doing so, the patterned resist layer is modified, resulting in a repair of the observed or identified defects. The bottom portion of FIG. 3 schematically shows the portion of the patterned resist layer 100 after the application of the additional scanning using a particle beam. As can be seen, the defective holes have been repaired, as can be seen by the enlarged contours 100.11 and 100.21.

In an embodiment, the present invention thus provides in a particle beam apparatus can both inspect an area of interest, e.g. an area on a substrate where one or more defects may have occurred, and repair defects that have been observed.

In an embodiment, the particle beam apparatus according to the present invention may be configured to perform both operations, i.e. the inspection of the substrate, in particular the patterned resist layer of the substrate, and the repair of the substrate, in particular the defects of the patterned resist layer of the substrate, using the same particle beam source. As an example, the particle beam source may comprise an electron beam source. In such embodiment, the processing unit of the particle beam apparatus may be configured to control the particle beam source to inspect the one or more defect target areas with a particle beam having a first operational parameter set point to control the particle beam source to repair the one or more defects with an particle beam having a second operational parameter set point intensity. In an embodiment, the operational parameter that is varied is an intensity of the particle beam, or a current of the particle beam, or a dwell time of the particle beam. Each of these operating parameters can be considered to affect the applied dose, e.g. expressed as µC/cm2 or electrons/nm2. In an embodiment of the present invention, the applied dose should be comparatively low for the inspection step and may be comparatively high for the repair or modification step. In such embodiment, the step of inspecting the one or more defect target areas is thus performed at a lower current, dwell time or intensity than the step of repairing the defects. By doing so, as will be appreciated by the skilled person, the undesired effect of resist shrinkage during the inspection step can be kept to a minimum, whereas the desired resist shrinkage during the repair step can be amplified. In practice, a local control of the applied dose, i.e. the amount of energy received at a particular location, can be realized by controlling the dwell time, i.e. the time a beam stays at the particular location.

Typically, the landing energy and the beam current may be kept at a fixed value; typical landing energies may be between 300 and 800 eV, typical beam currents may be between 1 and 100 nA. For performing inspection, a typical required dose will be about 30 electrons per pixel, a pixel being sized between 0.5 and 1 nm. In order to repair a defect, the required dose may e.g. be four times higher, e.g. 120 electrons per pixel.

Alternatively, the particle beam apparatus according to the invention may comprise two different particle beam sources. In such an apparatus, the particle beam source may e.g. comprise a first particle beam source to inspect the one or more defect target areas and a second particle beam source to repair the one or more defects. In such an embodiment, a particle beam source may be selected based on the required task. In particular, a less or low invasive particle beam source may be selected to perform the inspection of the one or more defect target areas, thereby reducing the resist shrinkage effect during the inspection, while a more invasive particle beam source may be selected to perform the repair step.

In an embodiment of the present invention, a low voltage, low current electron source of a CD-SEM could be applied to inspect the defect areas, whereas a high voltage, high current beam could be applied to locally repair the defects.

In an embodiment of the present invention, the inspection step is performed by means of a electron beam source, whereas heavier particles such as ions are used to perform the repair step.

In the embodiments as discussed above, the one or more defects that are identified, based on the results of the inspection of the defect target areas, were repaired by the shrinkage of material, in order to e.g. enlarge dimensions of contact holes. This shrinkage of material can be realized by subjecting the patterned resist layer to a particle beam such as an electron beam, as discussed above.

Alternatively, the present invention may be applied to repair defects by the addition of material. In order to ensure a proper operation of the semiconductor device that is manufactured, structures and/or features that are patterned have to be sized within predetermined limits. Typically, dimensions of structures and/or features need to be within certain ranges, e.g. having an upper and lower boundary or limit or threshold. Referring to the example of FIG. 3, contact holes such as contact holes 110 may have a required minimum diameter, e.g. diameter 120 as shown, but also a maximum diameter. As such, it may occur that contact holes, are patterned that are too large, i.e. whereby too much material, i.e. resist material, has been removed. In case such defects are identified, they may be repaired by the addition of material. Such an addition may e.g. be realized by means of electron beam induced deposition (EBID) or ion beam induced deposition (IBID). Such an electron beam or ion beam induced deposition or EBID/IBID involves a decomposition of gaseous molecules by means of an electron beam. When such an electron beam impinges on a substrate and gaseous molecules are brought towards it, material can be deposited on the substrate when the gaseous molecules are decomposed by the electron beam.

According to an aspect of the present invention, there is provided a defect repair method, the method including modifying a patterned resist layer that is obtained by an exposure process in order to repair one or more defects that are found in the patterned resist layer.

Figure 4:
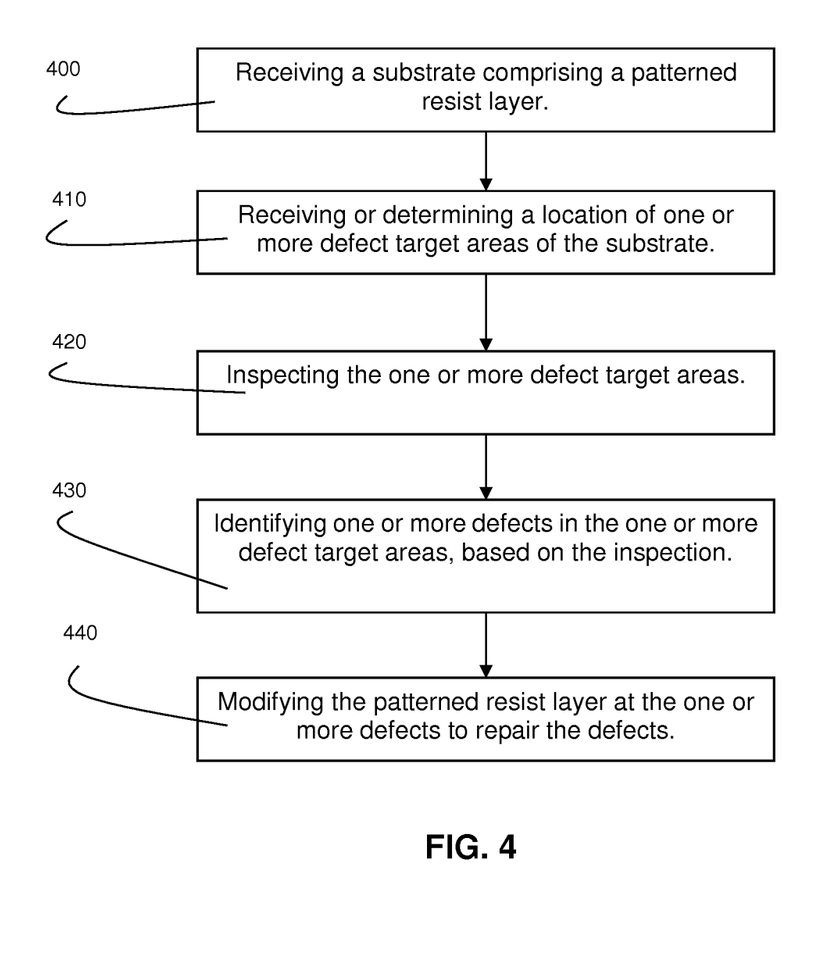
FIG. 4 depicts a flowchart of a defect repair method according to the present invention.

FIG. 4 schematically shows a flowchart of the method. The defect repair method according to the present invention comprises a first step 400 of receiving a substrate comprising a patterned resist layer. Such a patterned resist layer may e.g. be created by an exposure process as performed by a lithographic apparatus. In a next step 410, the defect repair method comprises receiving or determining a location of one or more defect target areas on the substrate. In an embodiment, the step 410 may involve receiving information indicative of the location of one or more defect target areas, i.e. areas on the substrate which might contain defects. Such information may e.g. be obtained from the lithographic apparatus which has performed the exposure process that resulted in the patterned resist layer. The lithographic apparatus that performed the exposure process may e.g. based on process parameters that have been logged during the exposure process, determine at which locations on the substrate the exposure process may have been less than optimal or at which locations certain process parameters were outside a desired range.

Alternatively, step 410 may involve determining the location of one or more defect target areas on the substrate. Such determination may e.g. be based on exposure process data representative of the exposure process performed to create the patterned resist layer.

In a next step 420, the defect repair method according to the present invention comprises inspecting the one or more defect target areas of the patterned resist layer. Such an inspection may e.g. be performed using a particle beam apparatus, e.g. a particle beam apparatus according to the present invention.

In a next step 430, the defect repair process according to the present invention comprises identifying one or more defects in the one or more defect target areas based on the inspection. In such a step, the method according to the present invention may involve, by processing the inspection data, whether certain patterned structures or features are flawed, e.g. having dimensions or other characteristics outside the specifications and, in case such flawed structures or features are found, determine their location or position. As mentioned above, structures or features may be considered flawed, i.e. identified as defects, when their dimensions are outside predetermined boundaries, e.g. both an upper boundary and a lower boundary. Structures or features can thus be too small or too big or may have a shape that deviates from a desired shape. The step of identifying the one or more defects may also include determining a location of the one or more defects within the defect target areas.

In a next step 440, the defect repair method according to the present invention comprises modifying the patterned resist layer at the one or more defects to repair the defects. As already mentioned above, modifying the patterned resist layer, in order to repair the defects may involve inducing a shrinkage of material of the patterned resist layer and/or the addition of material. Such a shrinkage of material may e.g. be realised using a particle radiation beam, e.g. an electron beam.

The addition of material may e.g. be realised by using a deposition method such as an electron beam induced deposition or EBID or ion beam induced deposition or IBID. In an embodiment, a step of adding material may be followed by a step of removing material, thereby e.g. removing part of the deposited material. Such an embodiment may be beneficial in case the accuracy of the material deposition step may be low or insufficient.

In accordance with an embodiment of the present invention, steps 420 and 440 may e.g. be performed using a particle beam apparatus. Such a particle beam apparatus may include a single particle beam source, which can e.g. be operated at different intensities. Alternatively, the particle beam apparatus may have two or more particle beam sources that operate at different intensities and/or that generate different particle beams, i.e. beams that consist of different particles, e.g. ions and electrons, e.g. an electron beam apparatus.

Figure 5:
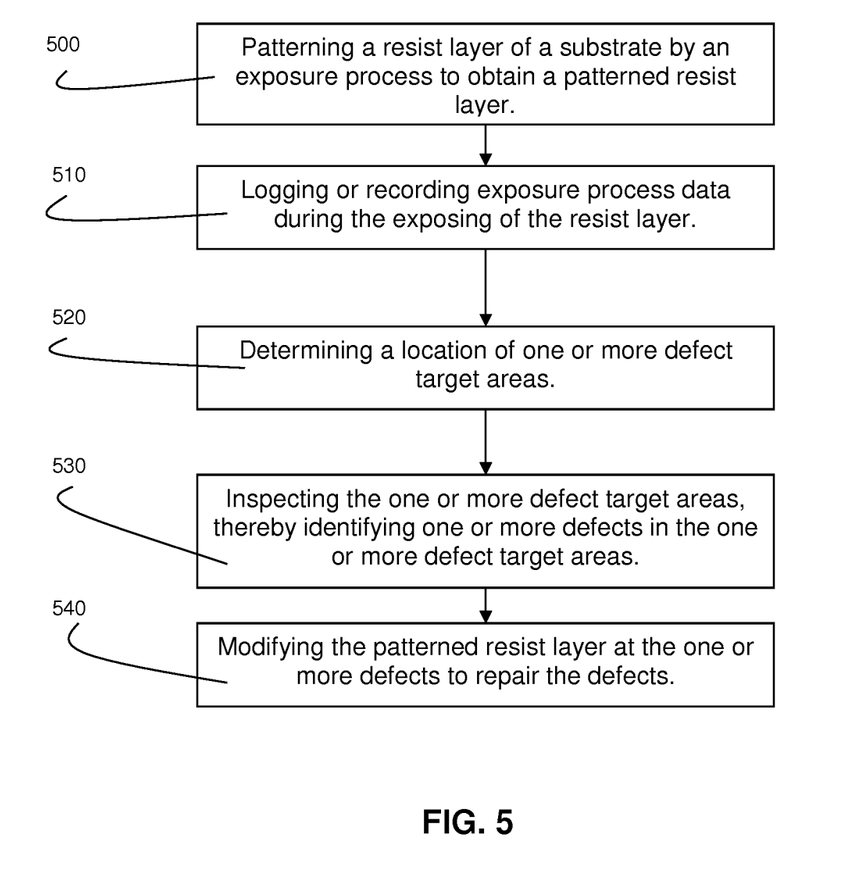
FIG. 5 depicts a flowchart of a lithographic exposure process according to the present invention.

According to an aspect of the present invention, there is provided a lithographic exposure process. FIG. 5 schematically shows a flowchart of such an exposure method.

In a first step 500, the method comprises patterning a resist layer of a substrate by exposing the resist layer to a patterned radiation beam. The method further comprises a second step 510 of logging or recording exposure process data during the exposing of the resist layer. As will be appreciated by the skilled person, a typical exposure process of a resist layer of a substrate by means of a lithographic apparatus may involve the scanning of a substrate through a patterned radiation beam. In such arrangement, the patterned radiation beam to which the substrate is exposed may e.g. be slit-shaped, e.g. having a width spanning the target portion on the substrate that is to be exposed. In order to accurately pattern the resist layer, various operating parameters need to be continuously within strict specifications. In particular, in order to properly pattern the resist layer with the desired pattern, each portion of the substrate exposed should receive the appropriate dosage of radiation. In addition, the exposed portions of the substrate should be kept in or close to a focal plane of the patterned radiation beam, in order to accurately pattern the substrate. Regarding the latter, it can be pointed out that in general, a surface of a substrate may not be entirely flat, rendering it difficult to maintain the exposed area of the substrate in focus. In this respect, it can be noted that typically, a substrate may be scanned, prior to being exposed to the patterned radiation beam with a height sensor, also referred to a level sensor, in order to determine a height map of the substrate. Such a height map may then be used to control a position of the object table onto which the substrate is positioned in such manner that the exposed portion of the substrate is, as good as possible, in a focal plane of the patterned radiation beam. During the exposure process, the actual operating parameters such as position of the object table or applied dosage can be monitored and logged or recorded. Such data, also referred to as exposure process data within the present invention, may be used to determine locations on the exposed substrate where defects might have occurred. Using such exposure process data, e.g. also including a determined height map of the substrate, one may identify locations on the exposed substrate where one or more operational parameters were outside a desired range. As an example, based on the exposure process data, one can determine certain locations on the substrate where an insufficient dosage of radiation has been applied, or where the substrate portions were outside a focal plane of the patterned radiation beam. Such locations are referred to as defect target areas within the meaning of the present invention. The technology to determine the locations of defect areas using operating parameters that are logged or recorded during the exposure process may be referred to as pattern fidelity metrology. More details on this technology can e.g. be found in U.S. Pat. Nos. 9,990,451, 9,507,907, 9,842,186 and US 2018/0031981, all of which are herein incorporated by reference. In a third step 520, the lithographic exposure process according to the present invention therefore comprises determining, based on the exposure process data, a location of one or more defect target areas. As mentioned, the location of such areas, i.e. areas which potentially contain one or more defects due to an out-of-spec exposure process, may be determined using logged or recorded exposure process data. In an embodiment of the present invention, the determination of the one or more locations of the defect target areas may be performed by the lithographic apparatus that has performed the exposure process. Alternatively, the exposure process data may be provided to an inspection tool or apparatus, e.g. a particle beam apparatus according to the present invention. Such an apparatus may then perform the step 520 to determine the location of the one or more defect target areas.

In a fourth step 530, the lithographic exposure process according to the present invention comprises inspecting the one or more defect target areas, thereby identifying one or more defects in the one or more defect target areas. Such an inspection step may e.g. be performed using a particle beam apparatus according to the present invention.

In a fifth step 540, the method comprises modifying the patterned resist layer at the one or more defects to repair the defects. Such a step may e.g. be performed by exposing the defects to a particle beam, e.g. an electron beam, so as to correct the patterned resist layer. In an embodiment, as also discussed above, the step of modifying the patterned resist layer may thus involve the deliberate shrinkage certain portions of the patterned resist layer, in order to repair the defects. The shrinkage of part of the patterned resist layer may e.g. be accomplished using a particle beam such as an electron beam. Subjecting a resist layer to such a particle beam may cause the shrinkage of resist at the location where the particle beam impinges the substrate. In a particle beam apparatus, a particle beam may be directed at a desired location at a high accuracy, thus enabling a selective modification of the resist layer. In particular, the application of an electron beam or other type of particle beam may result in a phenomenon known as resist shrinkage, whereby dimensions of patterned structures are affected by the application of a particle beam such as an electron beam. Alternatively, or in addition, the step of modifying the patterned resist layer may involve adding material to the patterned resist layer, e.g. by means of a deposition method such as an electron beam induced deposition.

By means of the fifth step 540, i.e. modifying the patterned resist layer by removing or adding material, defects such a structures or features having dimensions that are outside a desired range may be corrected or repaired.

In accordance with an aspect of the present invention, there is provided a lithographic system that is configured to perform the lithographic exposure process according to the present invention. Such a lithographic system may e.g. comprise a lithographic apparatus as e.g. shown in FIG. 1 for performing steps 500 and 510 of the lithographic exposure process according to the present invention. Such a system may further comprise a particle beam apparatus according to the present invention to perform the steps 530 and 540 of the lithographic exposure process according to the present invention. in such a system, either the lithographic apparatus or the particle beam apparatus may be configured to perform the step 520 of determining a location of the one or more defect target areas.

Figure 6A:
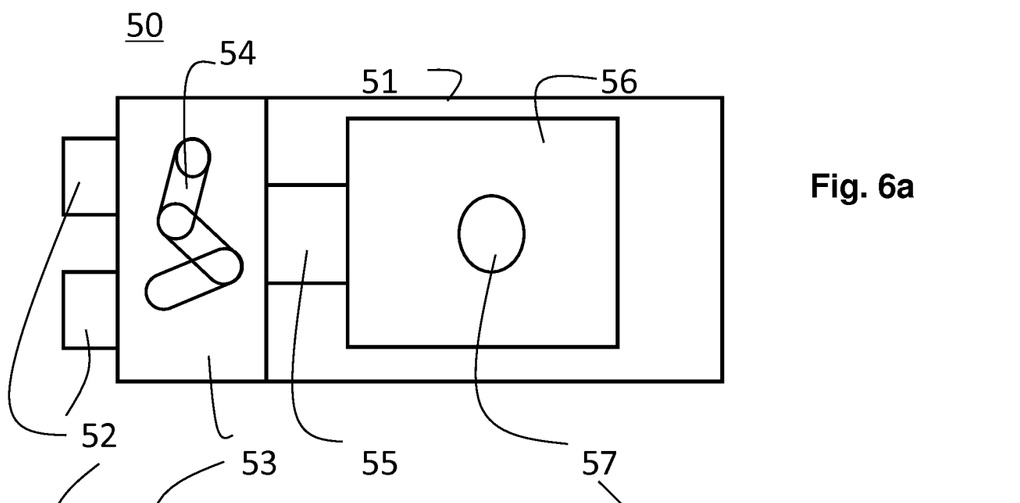
FIGS. 6a and 6b schematically depicts a top view and a side view of an inspection tool according to the present invention.
Figure 6B:
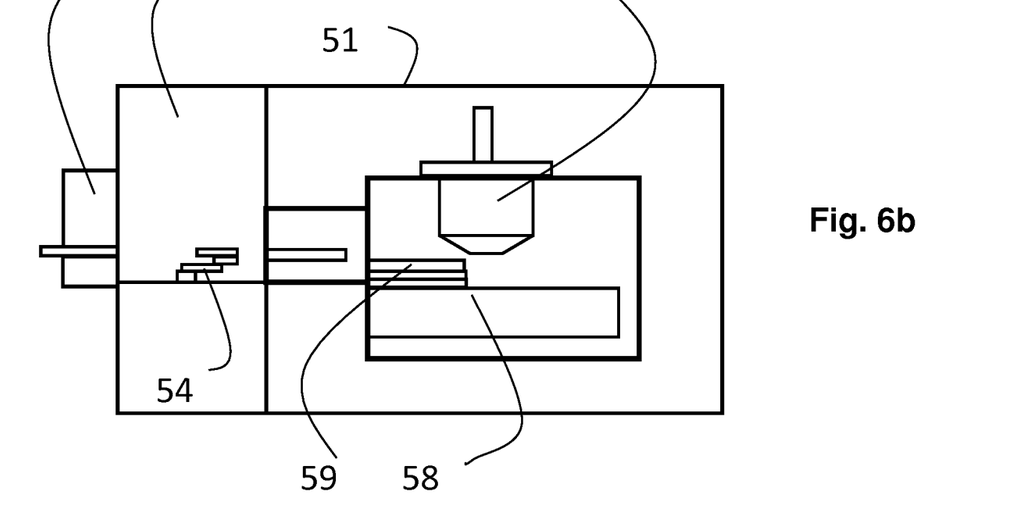
Figure 7:
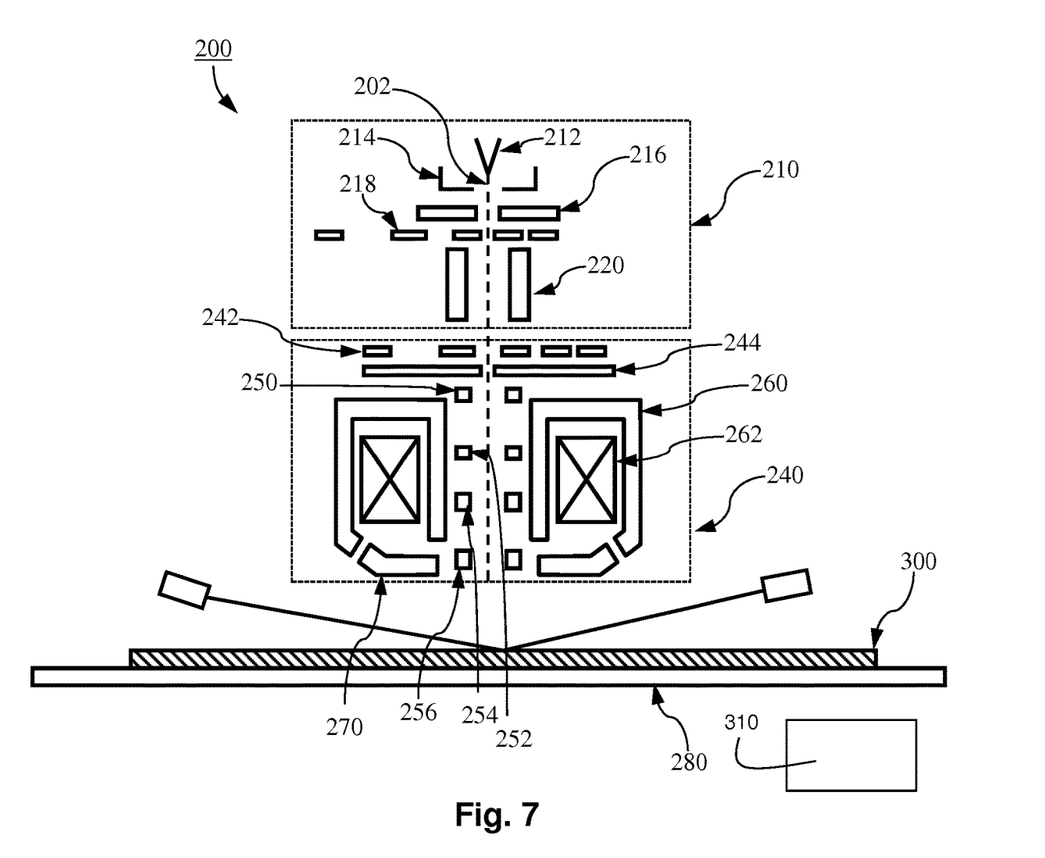
FIG. 7 schematically depicts a more detailed embodiment of an inspection tool according to the present invention.

For completeness, the following FIGS. 6a, 6b and 7 schematically show some further details of particle beam apparatuses which can be applied in a particle beam apparatus or lithographic system according to the present invention.

FIGS. 6A and 6B schematically depict a top view and a cross-sectional view of an particle beam apparatus 50 according to an embodiment of the present invention. The embodiment as shown comprises an enclosure 51, a pair of load ports 52 serving as an interface to receive objects to be examined and to output objects that have been examined. The embodiment as shown further comprises an object transfer system, referred as an EFEM, equipment front end module 53, that is configured to handle and/or transport the objects to and from the load ports. In the embodiment as shown, the EFEM 53 comprises a handler robot 54 configured to transport objects between the load ports and a load lock 55 of the EBI system 50. The load lock 55 is an interface between atmospheric conditions occurring outside the enclosure 51 and in the EFEM and the vacuum conditions occurring in a vacuum chamber 56 of the inspection tool 50. In the embodiment as shown, the vacuum chamber 56 comprises an particle beam source 57 configured to project an e-beam or particle beam onto an object to be inspected and/or repaired, e.g. a semiconductor substrate or wafer. The particle beam apparatus 50 further comprises a positioning device 58 that is configured to displace the object 59 relative to the particle beam generated by the particle beam source 57.

In an embodiment, the positioning device may comprise a cascaded arrangement of multiple positioners such an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 58 further comprises an object table for holding the object during the inspection process performed by the particle beam apparatus 50. In such embodiment, the object 59 may be clamped onto the object table by means of a clamp such as an electrostatic clamp. Such a clamp may be integrated in the object table.

FIG. 7 schematically depict a more detailed embodiment of a particle beam apparatus 200 according to the present invention, which can be configured to perform the defect repair method according to the present invention. The particle beam apparatus 200 comprises an e-beam source, referred to as the electron gun 210 and an imaging system 240.

The electron gun 210 comprises an electron source 212, a suppressor electrode 214, an anode 216, a set of apertures 218, and a condenser 220. The electron source 212 can be a Schottky emitter or modified Schottky emitter as discussed above. By the positive charge of the anode 216, the electron beam 202 can be extracted, and the electron beam 202 may be controlled by using a tunable aperture 218 which may have different aperture sizes for eliminating the unnecessary electron beam outside of the aperture. In order to condense the electron beam 202, the condenser 220 is applied to the electron beam 202, which also provides magnification. The condenser 220 shown in the FIG. 10 may e.g. be an electrostatic lens which can condense the electron beam 202. On the other hand, the condenser 220 can be also a magnetic lens.

The imaging system 240 may e.g. comprise a blanker, a set of apertures 242, a detector 244, four sets of deflectors 250, 252, 254, and 256, a pair of coils 262, a yoke 260, and an electrode 270. The electrode 270 may be used to retard and deflect the electron beam 202, and may further have an electrostatic lens function. Besides, the coil 262 and the yoke 260 may be configured to the magnetic objective lens.

The deflectors 250 and 256 can be applied to scan the electron beam 202 to a large field of view, and the deflectors 252 and 254 can be used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct a chromatic aberration of the electron beam 202, the retarder 270, the sample 300, and the yoke 260 or part thereof may form a lens to eliminate the chromatic aberration of the electron beam 202. The particle beam apparatus 200 further comprises a processing unit 310, which can e.g. be embodied as a processor, microprocessor, controller, or computer, the processing unit 310 being configured to receive a response signal from the detector or detectors, e.g.

detector 244, of the inspection tool and process the response signal into an image of the scanned or examined structure or sample 300.

The embodiments may further be described using the following clauses:

1. A particle beam apparatus comprising:
   an object table configured to hold a semiconductor substrate;
   a particle beam source configured to generate a particle beam;
   a detector configured to detect a response of the substrate caused by interaction of the particle beam with the substrate and to output a detector signal representative of the response;
   a processing unit configured to:
      receive or determine a location of one or more defect target areas on the substrate;
      control the particle beam source to inspect the one or more defect target areas;
      identify one or more defects within the one or more defect target areas, based on the detector signal obtained during the inspection of the one or more defect target areas;
      control the particle beam source to repair the one or more defects.
2. The particle beam apparatus according to clause 1, wherein the particle beam source comprises a beam deflector configured to direct the particle beam onto the substrate.
3. The particle beam apparatus according to clause 1 or 2, wherein the processing unit is configured to control an intensity of the particle beam.
4. The particle beam apparatus according to clause 3, wherein the processing unit is configured to control the particle beam source to inspect the one or more defect target areas with a particle beam having a first intensity and to control the particle beam source to repair the one or more defects with a particle beam having a second intensity, the second intensity being higher than the first intensity.
5. The particle beam apparatus according to any of the preceding clauses, wherein the particle beam source comprises an electron beam source.
6. The particle beam apparatus according to any of the preceding clauses, wherein the particle beam source comprises a first particle beam source and a second particle beam source.
7. The particle beam apparatus according to clause 6, wherein the first particle beam source comprises an electron beam source and the second particle beam source comprises an ion beam source.
8. The particle beam apparatus according to clause 6, wherein the first particle beam source comprises a first electron beam source and the second particle beam source comprises a second electron beam source.
9. The particle beam apparatus according to any of the clauses 6 to 8, wherein the processing unit is configured to control the first particle beam source to inspect the one or more defect target areas and to control the second particle beam source to repair the one or more defects.
10. The particle beam apparatus according to any of the preceding clauses, wherein the processing unit is configured to receive an input signal representing the location of the one or more defect target areas.
11. The particle beam apparatus according to any of the clauses 1 to 9, wherein the processing unit is configured to receive an input signal representing exposure process data and wherein the processing unit is configured to determine, based on the exposure process data, the location of the one or more defect target areas.
12. The particle beam apparatus according to any of the preceding clauses, wherein a defect refers to a structure or feature of the patterned resist layer having a dimension outside a predetermined range.
13. The particle beam apparatus according to clause 12, wherein the processing unit is configured to control the particle beam source to repair the one or more defects by applying a particle beam to the defects so as to modify the dimension to a modified dimension within the predetermined range.
14. The particle beam apparatus according to clause 13, wherein the step of modifying the dimension involves the shrinkage of resist of the patterned resist layer.
15. Defect repair method comprising:
   receiving a substrate comprising a patterned resist layer;
   receiving or determining a location of one or more defect target areas on the substrate;
   inspecting the one or more defect target areas of the patterned resist layer;
   determining a position of one or more defects in the one or more defect target areas based on the inspection;
   modifying the patterned resist layer at the one or more defects to repair the defects.
16. The method according to clause 15, wherein the step of inspecting the one or more defect target areas comprises scanning the one or more defect target areas with a particle beam.
17. The method according to clause 15 or 16, wherein the step of modifying the patterned resist layer at the one or more defects comprises exposing the one or more defects to a particle beam.
18. The method according to any of the clauses 15 to 17, wherein the particle beam comprises an electron beam.
19. Lithographic exposure process comprising:
   patterning a resist layer of a substrate by exposing the resist layer to a patterned radiation beam;
   logging or recording exposure process data during the exposing of the resist layer;
   determining, based on the exposure process data, a location of one or more defect target areas;
   inspecting the one or more defect target areas, thereby identifying one or more defects in the one or more defect target areas;
   modifying the patterned resist layer at the one or more defects to repair the defects.
20. The lithographic exposure process according to clause 19, wherein the step of inspecting the one or more defect target areas comprises scanning the one or more target areas with a particle beam.
21. The lithographic exposure process according to clause 19 or 20, wherein the step of modifying the patterned resist layer at the one or more defects comprises exposing the one or more defects to a particle beam.
22. The lithographic exposure process according to any of the clauses 19 to 21, wherein the particle beam comprises an electron beam.
23. Lithographic system configured to perform the lithographic exposure process according to any of the clauses 19 to 22.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A particle beam apparatus comprising:
    an object table configured to hold a substrate having at least a part of a semiconductor device and/or a resist layer;
    a particle beam source configured to generate a particle beam;
    a detector configured to detect a response of the substrate caused by interaction of the particle beam with the substrate and to output a detector signal representative of the response; and
    a processing unit configured to:
        receive or determine a location of one or more defect target areas on the substrate;
        control the particle beam source to inspect the one or more defect target areas;
        identify one or more defects within the one or more defect target areas, based on the detector signal obtained during the inspection of the one or more defect target areas; and
        control the particle beam source to repair the one or more defects.

2. The particle beam apparatus according to claim 1, wherein the particle beam source comprises a beam deflector configured to direct the particle beam onto the substrate.

3. The particle beam apparatus according to claim 1, wherein the processing unit is configured to control an intensity of the particle beam.

4. The particle beam apparatus according to claim 3, wherein the processing unit is configured to control the particle beam source to inspect the one or more defect target areas with a particle beam having a first intensity and to control the particle beam source to repair the one or more defects with a particle beam having a second intensity, the second intensity being higher than the first intensity.

5. The particle beam apparatus according to claim 1, wherein the particle beam source comprises an electron beam source.

6. The particle beam apparatus according to claim 1, wherein the particle beam source comprises a first particle beam source and a second particle beam source.

7. The particle beam apparatus according to claim 6, wherein the first particle beam source comprises an electron beam source and the second particle beam source comprises an ion beam source.

8. The particle beam apparatus according to claim 6, wherein the first particle beam source comprises a first electron beam source and the second particle beam source comprises a second electron beam source.

9. The particle beam apparatus according to claim 6, wherein the processing unit is configured to control the first particle beam source to inspect the one or more defect target areas and to control the second particle beam source to repair the one or more defects.

10. The particle beam apparatus according to claim 1, wherein the processing unit is configured to receive an input signal representing the location of the one or more defect target areas.

11. The particle beam apparatus according to claim 1, wherein the processing unit is configured to receive an input signal representing exposure process data and wherein the processing unit is configured to determine, based on the exposure process data, the location of the one or more defect target areas.

12. The particle beam apparatus according to claim 1, wherein a defect refers to a structure or feature of a patterned resist layer having a dimension outside a predetermined range.

13. The particle beam apparatus according to claim 12, wherein the processing unit is configured to control the particle beam source to repair the one or more defects by applying a particle beam to the one or more defects so as to modify the dimension to a modified dimension within the predetermined range.

14. A defect repair method comprising:
    receiving a substrate comprising a patterned resist layer;
    receiving or determining a location of one or more defect target areas on the substrate;
    inspecting the one or more defect target areas of the patterned resist layer;

determining a position of one or more defects in the one or more defect target areas based on the inspection; and modifying the patterned resist layer at the one or more defects to repair the defects.

15. The method according to claim 14, wherein the inspecting the one or more defect target areas comprises scanning the one or more defect target areas with a particle beam, and/or wherein the modifying the patterned resist layer at the one or more defects comprises exposing the one or more defects to a particle beam.

16. A computer product comprising a non-transitory computer-readable medium having instructions therein, the instructions, upon execution by a computer system, configured to cause the computer system to at least:

cause inspection of one or more defect target areas of a patterned resist layer;

determine a position of one or more defects in the one or more defect target areas based on the inspection; and cause modification of the patterned resist layer at the one or more defects to repair the defects.

17. The computer product of claim 16, wherein the instructions configured to cause modification of the patterned resist layer are configured to cause the modification by exposure of the one or more defects to a particle beam.

18. The computer product of claim 16, wherein the instructions configured to cause inspection of the patterned resist layer are configured to cause a particle beam source to inspect the one or more defect target areas with a particle beam having a first intensity and the instructions configured to cause modification of the patterned resist layer are configured to cause the particle beam source to repair the one or more defects with a particle beam having a second intensity, the second intensity being higher than the first intensity.

19. The computer product of claim 16, wherein the instructions are configured to cause inspection of the patterned resist layer with an electron beam source and the instructions configured to cause modification of the patterned resist layer are configured to cause modification of the patterned resist layer with an ion beam.

20. The computer product of claim 16, wherein the instructions configured to cause modification of the patterned resist layer are configured to cause a particle beam source to repair the one or more defects by application of a particle beam to the one or more defects so as to modify a dimension of a structure or feature of the patterned resist layer to within a predetermined range of the dimension.

* * * * *